(12) United States Patent
Hekmatshoartabari et al.

(10) Patent No.: US 9,263,616 B2
(45) Date of Patent: Feb. 16, 2016

(54) SELECTIVE EMITTER PHOTOVOLTAIC DEVICE

(71) Applicant: INTERNATIONAL BUSINESS MACHINES CORPORATION, Armonk, NY (US)

(72) Inventors: Bahman Hekmatshoartabari, White Plains, NY (US); Ali Khakifirooz, Mountain View, CA (US); Devendra K. Sadana, Pleasantville, NY (US); Ghavam G. Shahidi, Pound Ridge, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/527,274

(22) Filed: Oct. 29, 2014

(65) Prior Publication Data
US 2015/0059841 A1    Mar. 5, 2015

Related U.S. Application Data

(63) Continuation of application No. 13/749,263, filed on Jan. 24, 2013, now Pat. No. 8,912,529, which is a continuation of application No. 13/706,820, filed on Dec. 6, 2012, now Pat. No. 8,912,071.

(51) Int. Cl.
*H01L 21/02* (2006.01)
*H01L 29/08* (2006.01)
(Continued)

(52) U.S. Cl.
CPC ........ *H01L 31/065* (2013.01); *H01L 31/02168* (2013.01); *H01L 31/022433* (2013.01); *H01L 31/068* (2013.01); *H01L 31/1804* (2013.01); *Y02E 10/50* (2013.01)

(58) Field of Classification Search
None
See application file for complete search history.

(56) References Cited

U.S. PATENT DOCUMENTS

| 5,580,381 A | 12/1996 | Yamagata |
| 7,468,485 B1 | 12/2008 | Swanson |

(Continued)

FOREIGN PATENT DOCUMENTS

| CN | 102157612 | 8/2011 |
| KR | 20110018648 | 2/2011 |

(Continued)

OTHER PUBLICATIONS

Hekmatshoartabari, B., et al. "Selective Emitter Photovoltaic Device" Non Final Office Action for U.S. Appl. No. 13/749,263 mailed on Oct. 17, 2013. (17 Pages).

(Continued)

*Primary Examiner* — Stanetta Isaac
(74) *Attorney, Agent, or Firm* — Tutunjian & Bitetto; Louis J. Percello

(57) ABSTRACT

A method for fabricating a photovoltaic device includes forming a patterned layer on a doped emitter portion of the photovoltaic device, the patterned layer including openings that expose areas of the doped emitter portion and growing an epitaxial layer over the patterned layer such that a crystalline phase grows in contact with the doped emitter portion and a non-crystalline phase grows in contact with the patterned layer. The non-crystalline phase is removed from the patterned layer. Conductive contacts are formed on the epitaxial layer in the openings to form a contact area for the photovoltaic device.

9 Claims, 5 Drawing Sheets

(51) Int. Cl.
*H01L 29/737* (2006.01)
*H01L 31/00* (2006.01)
*H01L 31/065* (2012.01)
*H01L 31/068* (2012.01)
*H01L 31/18* (2006.01)
*H01L 31/0216* (2014.01)
*H01L 31/0224* (2006.01)

(56) References Cited

U.S. PATENT DOCUMENTS

| | | |
|---|---|---|
| 7,476,420 B2 | 1/2009 | Skarp et al. |
| 7,737,357 B2 | 6/2010 | Cousins |
| 7,816,236 B2 | 10/2010 | Bauer et al. |
| 7,999,175 B2 | 8/2011 | Nakayashiki et al. |
| 8,153,496 B1 | 4/2012 | Ramappa |
| 8,202,789 B2 | 6/2012 | Anella et al. |
| 2006/0130891 A1 | 6/2006 | Carlson |
| 2006/0234504 A1 | 10/2006 | Bauer et al. |
| 2007/0235759 A1 | 10/2007 | Henson et al. |
| 2008/0000521 A1 | 1/2008 | Sivoththaman et al. |
| 2008/0230116 A1 | 9/2008 | Kannou et al. |
| 2009/0215219 A1 | 8/2009 | Ajiki et al. |
| 2009/0314341 A1 | 12/2009 | Borden et al. |
| 2010/0059109 A1 | 3/2010 | Nakayashiki et al. |
| 2010/0186802 A1 | 7/2010 | Borden |
| 2011/0041899 A1 | 2/2011 | Josell et al. |
| 2011/0041902 A1 | 2/2011 | Krokoszinski et al. |
| 2011/0041908 A1 | 2/2011 | Harder |
| 2011/0056551 A1 | 3/2011 | Kim et al. |
| 2011/0070681 A1 | 3/2011 | Nakayashiki et al. |
| 2011/0120541 A1 | 5/2011 | Cabarrocas et al. |
| 2011/0132444 A1* | 6/2011 | Meier et al. ............... 136/255 |
| 2011/0139229 A1 | 6/2011 | Rohatgi et al. |
| 2011/0214719 A1 | 9/2011 | Li et al. |
| 2011/0240997 A1* | 10/2011 | Rockenberger et al. ........ 257/49 |
| 2011/0272012 A1 | 11/2011 | Heng et al. |
| 2011/0277833 A1 | 11/2011 | Miller et al. |
| 2012/0073647 A1 | 3/2012 | Stangl et al. |
| 2012/0125416 A1 | 5/2012 | Rohatgi et al. |
| 2013/0228221 A1 | 9/2013 | Moslehi et al. |
| 2014/0000695 A1 | 1/2014 | Stone |

FOREIGN PATENT DOCUMENTS

| | | |
|---|---|---|
| KR | 20110027218 | 3/2011 |
| WO | WO2009094578 A2 | 7/2009 |
| WO | WO2011014068 A1 | 2/2011 |
| WO | WO2011127147 A1 | 10/2011 |
| WO | WO20110143341 | 11/2011 |
| WO | WO2012022349 A2 | 2/2012 |

OTHER PUBLICATIONS

Kuthi, E. "Crystalline Silicon Solar Cells With Selective Emitter and the Self-Doping Contact" Híradástechnika (2004) . Jun. 2004. pp. 21-31.

Osborne, M. "Schmid's Selective Emitter Technology Supports Sunrise Global Solar's Record 19.2% Cell Efficiencies" www.pv-tech.org. Apr. 2011. (3 Pages) http://www.pv-tech.org/ news/schmids_selective_emitter_technology_supports_sunrise_global_solars_record.

Tucci, M., et al. "Back Enhanced Heterostructure With Interdigitated Contact—Behind-Solar Cell" Conference on Optoelectronic and Microelectronic Materials and Devices, 2008. Jul./Aug. 2008. pp. 242-245.

List of IBM Patents or Patent Applications Treated as Related. (2 Pages).

* cited by examiner

SELECTIVE EMITTER PHOTOVOLTAIC DEVICE

RELATED APPLICATION INFORMATION

This application is a Continuation application of U.S. patent application Ser. No. 13/749,263, filed on Jan. 24, 2013, incorporated herein by reference in its entirety. U.S. patent application Ser. No. 13/749,263 is a Continuation application of U.S. patent application Ser. No. 13/706,820 filed on Dec. 6, 2012, incorporated herein by reference in its entirety. This application is related to commonly assigned co-pending U.S. patent application Ser. No. 13/032,866 filed on Feb. 23, 2011, and incorporated herein by reference in its entirety.

BACKGROUND

1. Technical Field

The present invention relates to photovoltaic devices, and more particularly to selective emitter photovoltaic device structures which include epitaxial grown layers to repel minority carriers from contact areas.

2. Description of the Related Art

Selective emitter structures improve conversion efficiency of solar cells as compared with single emitter structures. The selective emitter structures repel minority carriers from metal contact regions at the emitter by employing locally high doping levels at the contact regions. However the formation of the locally high doping regions requires long drive-in steps to drive-in dopants at high temperatures.

A single-emitter structure employs a single $n^+$ diffusion to form an emitter and is currently an industry mainstream structure. Single-emitter devices can currently achieve a conversion efficiency range of between about 18-19% in production.

A double-emitter structure employs an $n^{++}$ diffusion to passivate contacts. This is believed to be necessary to improve efficiency, which in some cases reaches over 20%. However, the double-emitter structure suffers from the time and expense of long drive-in steps to form the $n^{++}$ regions at high temperatures. The long drive-in steps to form $n^{++}$ regions at the high temperatures may degrade the lifetime of solar grade wafers by activating impurities or forming boron-oxygen complexes.

SUMMARY

A method for fabricating a photovoltaic device includes forming a patterned layer on a doped emitter portion of the photovoltaic device, the patterned layer including openings that expose areas of the doped emitter portion and growing an epitaxial layer over the patterned layer such that a crystalline phase grows in contact with the doped emitter portion and a non-crystalline phase grows in contact with the patterned layer. The non-crystalline phase is removed from the patterned layer. Conductive contacts are formed on the epitaxial layer in the openings to form a contact area for the photovoltaic device.

Another method for fabricating a photovoltaic device includes forming a first emitter on a monocrystalline substrate; forming a patterned layer on the first emitter, the patterned layer including openings that expose areas of the first emitter; growing an epitaxial layer over the patterned layer such that a crystalline phase grows in contact with the first emitter and a non-crystalline phase grows in contact with the patterned layer; removing the non-crystalline phase from the patterned layer such that the crystalline form in contact with the first emitter forms a second emitter; and forming metal fingers on the epitaxial layer in the openings to form a contact area of the photovoltaic device.

Yet another method for fabricating a photovoltaic device includes forming a first emitter on a monocrystalline substrate; forming a patterned layer on the first emitter, the patterned layer including openings that expose areas of the first emitter, the patterned layer including one or more of a passivation layer and an anti-reflection coating; doping portions of the first emitter to form highly doped diffusion regions having a dopant concentration greater than other portions of the first emitter, the highly doped diffusion regions corresponding with locations of the openings in the patterned layer; growing an epitaxial layer over the patterned layer such that a crystalline phase grows in contact with the first emitter and a non-crystalline phase grows in contact with the patterned layer; removing the non-crystalline phase from the patterned layer such that the crystalline form in contact with the first emitter forms a second emitter; and forming metal fingers on the epitaxial layer in the openings to form a contact area of the photovoltaic device.

A photovoltaic device includes a contact area including: a doped emitter layer; and a patterned layer formed on the doped emitter layer. The patterned layer includes openings that expose areas of the doped emitter layer. An epitaxial layer has a crystalline phase grown in contact with the doped emitter portion. Conductive contacts are formed on the epitaxial layer in the openings.

Another photovoltaic device includes a first emitter formed on a monocrystalline substrate, and a patterned layer formed on the first emitter. The patterned layer includes openings that expose areas of the first emitter. An epitaxial layer is formed in the openings of the patterned layer such that a crystalline phase grows in contact with the first emitter and forms a second emitter. Metal fingers are formed on the epitaxial layer in the openings to form a contact area.

Yet another photovoltaic device includes a first emitter formed on a monocrystalline substrate, and a patterned layer formed on the first emitter. The patterned layer includes openings that expose areas of the first emitter. The patterned layer further includes one or more of a passivation layer and an anti-reflection coating. Highly doped diffusion regions are formed in the first emitter and have a dopant concentration greater than other portions of the first emitter. The highly doped diffusion regions correspond with locations of the openings in the patterned layer. An epitaxial layer is formed in the openings of the patterned layer such that a crystalline phase is in contact with the first emitter and forms a second emitter. Metal fingers are formed on the epitaxial layer in the openings to form a contact area.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
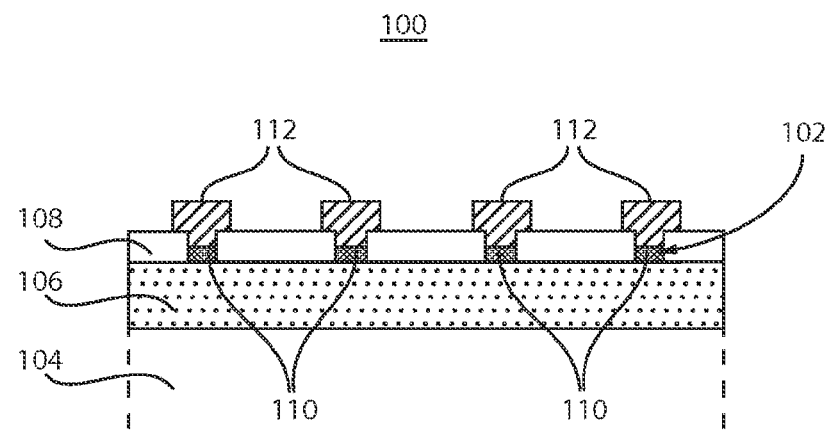
FIG. 1 is a cross-sectional view of a photovoltaic device having an epitaxial layer formed between an emitter layer and conductive contacts (e.g., metal fingers) in accordance with the present principles.

In accordance with the present principles, selective emitter photovoltaic device structures are disclosed, which include highly doped thin epitaxial layers to repel minority carriers from contact areas at front and back ends of photovoltaic cells. A method of forming photovoltaic cell structures by selective epitaxial growth of the highly doped layer(s) using plasma enhanced chemical vapor deposition is provided. The epitaxial growth is preferably a low temperature process to avoid damage to other areas of the photovoltaic device. The efficiency of solar devices made in accordance with the present principles is expected to exceed those of single-emitter designs and other double-emitter designs.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., GaInP, InGaAs or SiGe. These compounds include different proportions of the elements within the compound, e.g., InGaAs includes $In_xGa_yAs_{1-x-y}$, where x, y are less than or equal to 1, or SiGe includes $Si_xGe_{1-x}$ where x is less than or equal to 1, etc. In addition, other elements may be included in the compound, such as, e.g., AlInGaAs, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc. It is also to be understood that the present invention may include tandem (multi-junction) structures. The tandem structure may include cells having different materials and layers.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a photovoltaic device structure 100 is shown in accordance with one illustrative embodiment. It should be understood that the present principles will be described illustratively in terms of a selective emitter (SE) device structure. This structure should not be construed as limiting as other device structures may benefit from the present principles. The structure 100 of the selective emitter includes a highly doped layer (e.g., $n^{++}$) 102 that may be employed for forming an emitter and/or dopant diffusion regions that do not employ a long drive-in step for dopant diffusion. The highly doped thin layer 102 is preferably grown epitaxially by a selective low-temperature epitaxial growth process using plasma-enhanced chemical vapor deposition (PECVD). Other techniques such as hot-wire CVD (HWCVD), etc. may also be employed.

A substrate 104 may include a monocrystalline material, such as Si, Ge, SiGe, SiC, etc. The substrate 104 is doped and may be p-doped or n-doped. In the example described, the substrate 104 includes a p-type dopant; however, one skilled in the art would recognize that the conductivities of the layers may be reversed from the described example. In one embodiment, the substrate 104 is p-doped and a first diffused emitter 106 is formed by providing an n-doped portion of the substrate 104. The first diffused emitter 106 has a passivation layer and/or anti-reflection coating (ARC) layers 108 formed thereon. The first emitter 106 is doped ($n^+$) and has an activated doping level below $10^{19}$ cm$^{-3}$. The first emitter 106 may be shallower than about 1 micron. The first emitter layer 106 may be part of the substrate 104 (and counterdoped) or may be grown on the substrate 104 by, e.g., an epitaxial growth process. The first emitter 106 may be in-situ doped with a dopant type opposite the dopant type of the substrate 104. A second emitter 110 is formed from the epitaxial layer 102 on the first emitter 106. The passivation/ARC layer 108 is opened up to expose portions of the first emitter 106 and permit the formation of the second emitter 110. The second emitter 110 is doped ($n^{++}$) and has an activated doping level between $10^{19}$ and $5 \times 10^{20}$ cm$^{-3}$.

Metal fingers 112 are formed in contact with the second emitter 110 in between portions of the passivation/ARC layers 108. The metal fingers 112 may include, e.g., tungsten, silver, aluminum, etc.). Metal fingers 112 permit for low electrical contact resistance.

Figure 2:
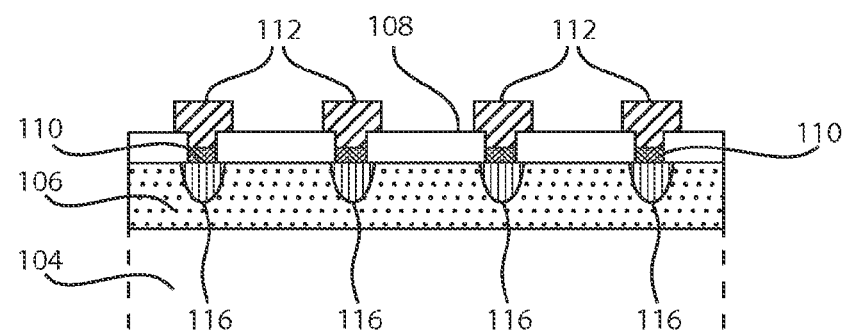
FIG. 2 is a cross-sectional view of a photovoltaic device having highly doped diffusion regions formed in an emitter layer in accordance with the present principles.

Referring to FIG. 2, in one embodiment, diffusion regions 116 are formed in the first emitter 106. The diffusion regions 116 may include $n^{++}$ regions. By employing epitaxial layers for the second emitter 110, the $n^+$ epi-layer of the second emitter 110 permits a shallower $n^{++}$ diffusion region 116. In one example, the diffusion region extends to a position less than about 0.5 microns (out of about 1 micron). This results in a shorter drive-in process for forming regions 116. The $n^+$ epi-layer for the second emitter 110 is grown after $n^{++}$ diffusion for the diffusion regions 116. In another embodiment, the regions 116 are formed after the deposition of the epi-layer 102. The regions 116 may be formed using dopants of the epi-layer 102, which can be diffused into the first emitter 106 by an anneal process.

Figure 3:
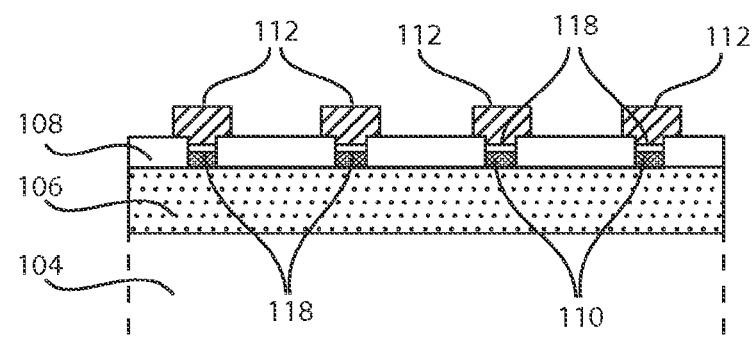
FIG. 3 is a cross-sectional view of a photovoltaic device having a surface passivation layer formed between an epitaxial layer and metal fingers in accordance with the present principles.

Referring to FIG. 3, in another embodiment, a surface passivation layer 118 may be employed. The surface passivation layer 118 may include, e.g., $n^+$ or i a-Si:H for surface passivation ($p^+$ or i a-Si:H for p+ first emitters). Other passivation materials may be employed as well. The passivation layer 118 may include nanocrystalline or microcrystalline Si:H as well. Other passivation layer 118 materials, such as, e.g., $Al_2O_3$ may be employed, although some material used to passivate the metal contacts 116 can result in fill-factor loss due to large bandgaps. In particularly useful embodiments, amorphous, nanocrystalline or microcrystalline Si:H having a thickness of between about 1 to about 15 nm, and more preferably between about 2 and about 5 nm may be employed for surface passivation layer 118. It should be understood that the embodiments of FIGS. 1, 2 and 3 may be employed together or in any combination.

Referring to FIGS. 4-7, method steps for forming a contact area for a photovoltaic device configured to repel minority carriers is illustratively shown in accordance with an illustrative embodiment.

Figure 4:
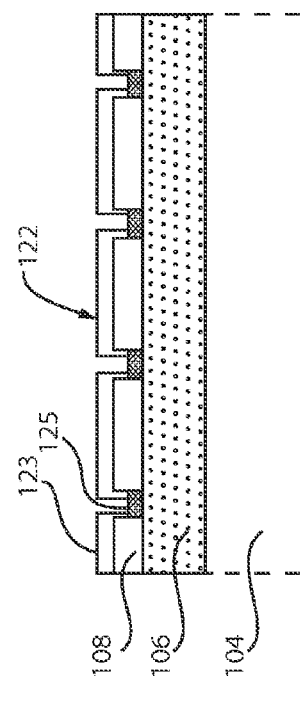
FIG. 4 is a cross-sectional view of a photovoltaic device having a patterned layer configured with openings on an emitter layer in accordance with the present principles.

Referring to FIG. 4, the substrate 104 is doped to form the first emitter 106. The first emitter 106 may include a dopant concentration of less than $10^{19}$ cm$^{-3}$ (n+), a comparable doping concentration may be provided for a p-type first emitter 106 formed in an n-type dopant substrate 104. After the first emitter diffusion, a patterned passivation/ARC layer or layers 108 are formed on the first emitter 106 and patterned to form openings 120. Patterning may include the use of any known patterning process, such as, e.g., lithography. At this time, the diffusion regions 116 of FIG. 2 may be formed through the openings 120.

Figure 5:
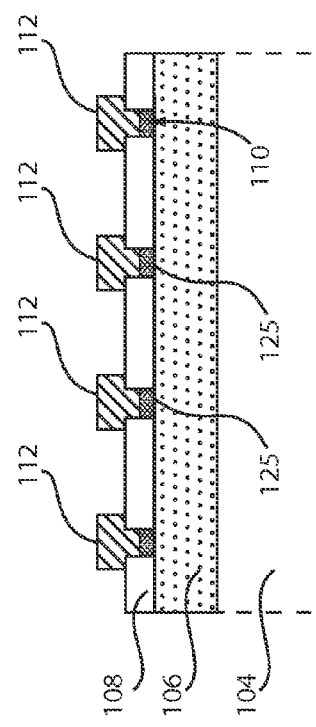
FIG. 5 is a cross-sectional view of the photovoltaic device of FIG. 4 having an epitaxial layer formed on the patterned layer and in the openings in accordance with the present principles.

Referring to FIG. 5, an epitaxial layer 122 (e.g., $n^+$) is grown selectively on exposed portions of the first emitter 106 through the passivation/ARC layer 108 (in areas where the passivation/ARC layer 108 has been removed by patterning). The epitaxial layer 122 may be doped in-situ or by other methods. The epitaxial layer 122 may include a Si containing layer or a Ge containing layer grown by plasma enhanced chemical vapor deposition (PECVD) resulting in non-crystalline material 123 on top of the passivation/ARC layer 108, and crystalline layers 125 (second emitter 110) on top of the substrate surface (openings in passivation/ARC layer 108). The non-crystalline layers 123 may be removed selectively, e.g., by an in-situ dry etch technique, e.g., using hydrogen plasma or other etching materials.

In particularly useful embodiments, the epitaxial layer 122 includes hydrogen content in the range of about 5-40% (atomic percent), and may include germanium (Ge), carbon (C), fluorine (F), deuterium (D), nitrogen (N) and combinations thereof. Non-crystalline refers to amorphous, nanocrystalline or microcrystalline, while crystalline refers to single crystalline or poly crystalline. The gas source providing Si for the epitaxial layer 122 may include silane ($SiH_4$), other gases such as disilane ($Si_2H_6$), dichlorosilane (DCS), tetrafluorosilane ($SiF_4$) or combinations thereof may be used as well. The gas source providing Ge for Ge containing layers may include germane ($GeH_4$). In-situ p-type doping may be performed using diborane ($B_2H_6$) or trimethylboron (TMB) sources, and in-situ n-type doping may be performed using a phosphine (PH$_3$) gas source, although other dopant sources may be used as well.

In one embodiment, the selective epitaxial growth of silicon is performed in a hydrogen diluted silane environment using a plasma enhanced chemical vapor deposition process (PECVD). The gas ratio of hydrogen gas to silane gas ([H$_2$]/[SiH$_4$]) at 150 degrees C. is preferably between 0 to about 1000. In particularly useful embodiments, epitaxial growth of silicon begins at a gas ratio of about 5-10. The epitaxial Si quality is improved by increasing the hydrogen dilution, e.g., to 5 or greater.

Epitaxial silicon can be grown using various gas sources, e.g., silane (SiH$_4$), dichlorosilane (DCS), SiF$_4$, SiCl$_4$ or the like. The quality of epitaxial silicon improves by increasing the dilution of hydrogen using these or other gases. For higher hydrogen dilution, smoother interfaces were produced (epitaxial silicon to crystalline silicon) and fewer stacking faults and other defects were observed.

Radio-frequency (RF) or direct current (DC) plasma enhanced chemical vapor deposition (CVD) is preferably performed at deposition temperature ranges from about room temperature to about 400 degrees C., and preferably from about 150 degrees C. to about 250 degrees C. Plasma power density may range from about 2 mW/cm$^2$ to about 2000 mW/cm$^2$. A deposition pressure range may be from about 10 mTorr to about 5 Torr.

A carrier gas such as hydrogen (H$_2$), deuterium (D$_2$), helium (He) or argon (Ar) may be used for any or all of the layers. The carrier gas may be pre-mixed with the gas sources or flowed simultaneously with the gas source at the time of growth. The gas flow ratio is preferably [H$_2$]/[SiH$_4$]>5. For p$^{++}$ growth (n-type substrate), Ge may be included in the layer 122. In this case, the gas flow ratio is preferably [H$_2$]/([SiH$_4$]+[GeH$_4$])>5. The growth temperature for the epitaxial layer 122 may be less than about 400 degrees C. and more preferably between 150 and 250 degrees C., although higher or lower temperatures may be employed as well. Low-temperature epitaxial growth PECVD to passivate contacts preferably include in-situ doping of n$^{++}$ layer 122 (with an activated doping range of between about 10$^{18}$ and about 3×10$^{20}$ cm$^{-3}$. The epitaxial layer 122 may include a thickness of between about 2 nm and about 100 nm, and preferably between 5 nm-25 nm.

In one embodiment, an etching process of amorphous silicon may be employed to concurrently form epitaxial silicon on exposed crystalline silicon areas. It should be understood that the epitaxial growth and etching may be performed sequentially or concurrently as needed. Silicon is deposited at, e.g., 500 mTorr, [H$_2$]/[SiH$_4$]=14 and power density of 4 mW/cm$^2$. As a result, the silicon is epitaxial within the open areas 120 where the silicon is exposed to e.g., c-Si of the substrate 104. The silicon on the layer 108 forms as non-epitaxial (e.g., amorphous) silicon. A H$_2$ plasma etch may be performed at, e.g., 150 degrees C. at 900 mTorr, resulting in an etch selectivity of approximately 1:3 for c-Si (crystalline layer 125) with respect to a-Si:H (non-crystalline layer 123). It should be understood that a non-epitaxial portion (amorphous Si) grown on insulator materials can be etched using gases such as, e.g., H$_2$, HCl, Cl$_2$, Ar, etc. The epitaxial deposition and the H$_2$ plasma etch may be performed sequentially or concurrently in a same chamber. The selective epitaxial growth can be achieved either by alternating gas pulses responsible for the epitaxial growth (e.g., silane and dopant species) and the etch (plasma etchants, e.g., H$_2$, HCl, etc.) or by simultaneous flow of all the gases. In one embodiment, the diffusion regions 116 may be formed at a later time by driving dopants from the crystalline portions 125 into the emitter 106.

Figure 6:
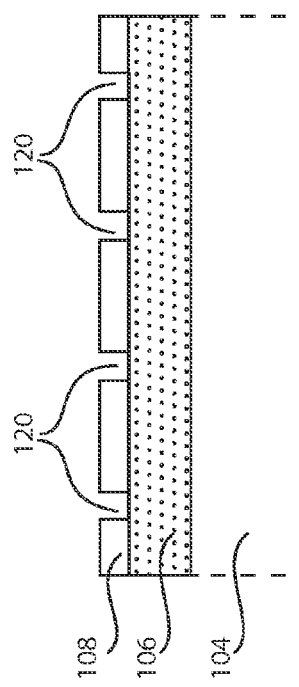
FIG. 6 is a cross-sectional view of the photovoltaic device of FIG. 5 having non-crystalline portions of the epitaxial layer removed from the patterned layer in accordance with the present principles.

Referring to FIG. 6, whether or not the selective etching/deposition process is employed, the non-crystalline layers 123 are removed selectively, e.g., by an in-situ dry etch technique. The dry etch may include, e.g., a hydrogen plasma etch, as described; however, ex-situ removal of the non-crystalline layer 123 may include employing a wet etch with a wet chemistry, such as, dilute HF (hydrofluoric acid). Other plasma gases and wet etchants may also be employed.

Figure 7:
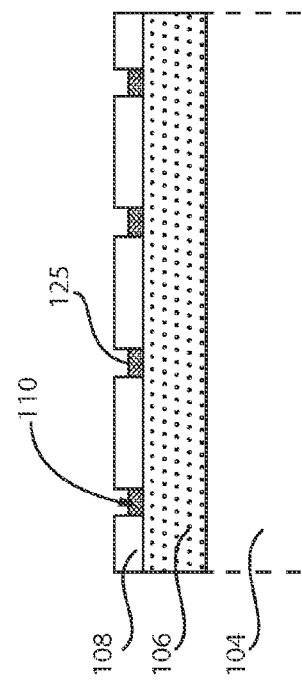
FIG. 7 is a cross-sectional view of the photovoltaic device of FIG. 6 showing metal fingers formed in accordance with the present principles.

Referring to FIG. 7, surface passivation layers 118 (FIG. 3) may be formed at this time. A layer of metal is formed over the passivation/ARC layer 108 and over the crystalline layers 125 that form the second emitter 110. The metal layer is patterned to form the metal fingers 112 for an emitter contact. The metal layer may be deposited by electroplating, screen printing or other deposition processes.

As described above, a selective growth process provides crystalline growth on the substrate 104 (first emitter 106), and non-crystalline growth on the passivation/ARC layer 108. The non-crystalline portion 125 may be removed selectively, e.g., by H plasma. In another embodiment, a non-selective deposition process may include forming and patterning the metal fingers 112. The metal fingers may then be employed as a hard mask to remove the non-crystalline portion 125 on top of the passivation/ARC layer 108.

Figure 8:
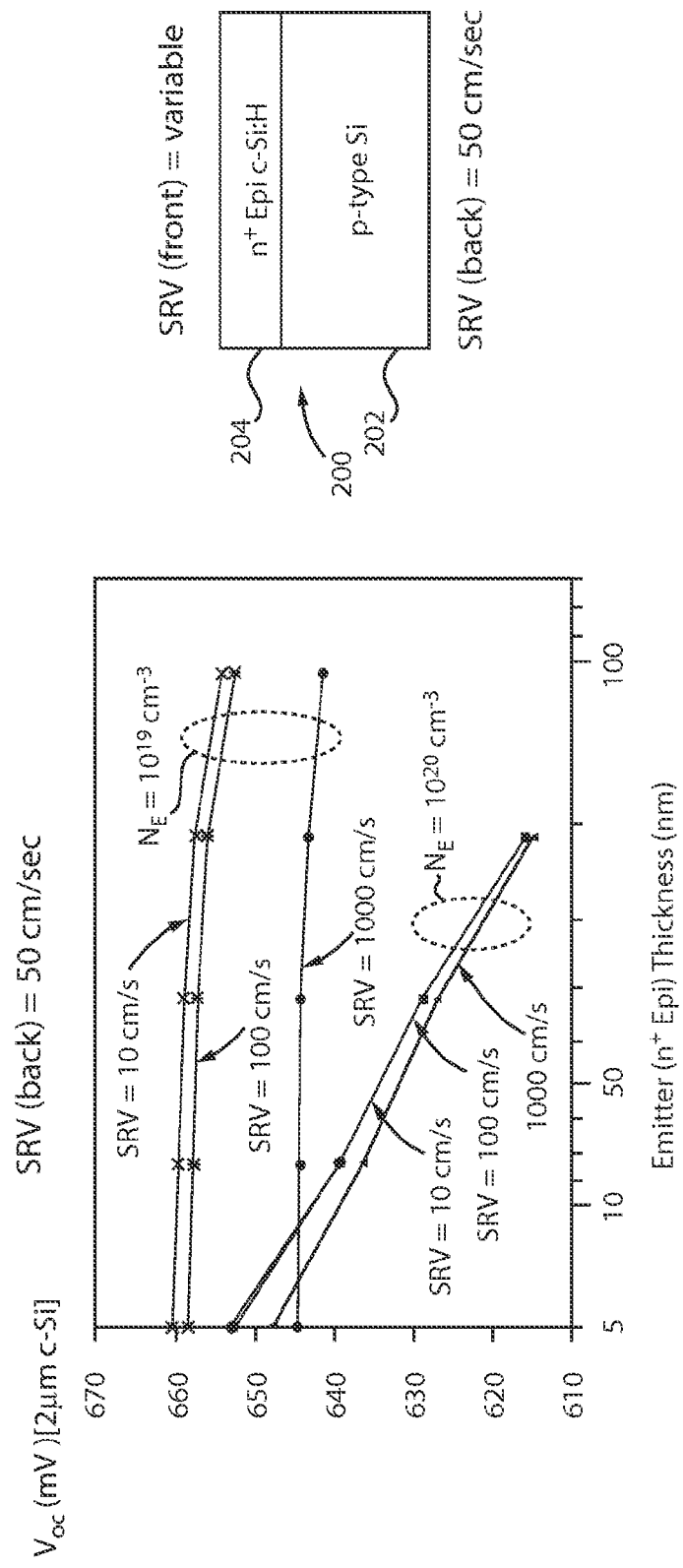
FIG. 8 is a diagram, showing open circuit voltage ($V_{OC}$) in mV versus emitter thickness in nm, and plotting surface recombination velocity (SRV) at 10, 100 and 1000 cm/s for two doping levels ($N_E=10^{19}$ cm$^{-3}$ and $N_E=10^{20}$ cm$^{-3}$) in accordance with the present principles.

Referring to FIG. 8, a diagram, showing simulated open circuit voltage (V$_{OC}$) in mV versus emitter thickness in nm, for three surface recombination velocity (SRV) levels of 10, 100 and 1000 cm/s and two doping levels (N$_E$=10$^{19}$ cm$^{-3}$ and N$_E$=10$^{20}$ cm$^{-3}$). A device structure 200 used for simulation includes a 2 micron thick p-type monocrystalline Si substrate 202. The substrate 202 has an n+ emitter 204 which could be formed thereon by an epitaxial process in accordance with the present principles. A constant SRV of 50 cm/s was considered for the back side of the substrate 202 while SRV was varied for the front side in the simulation. The simulation shows that high doping in n$^+$ epi emitter 204 (including crystalline Si:H) reduces sensitivity to surface recombination velocity (SRV). This is because the number of minority carriers (holes in this case) reaching the surface is reduced due to the high electric field. As a result, a thin layer of amorphous, nanocrystalline (nc), and/or microcrystalline (μc) Si:H is sufficient to passivate the surface.

Figure 9:
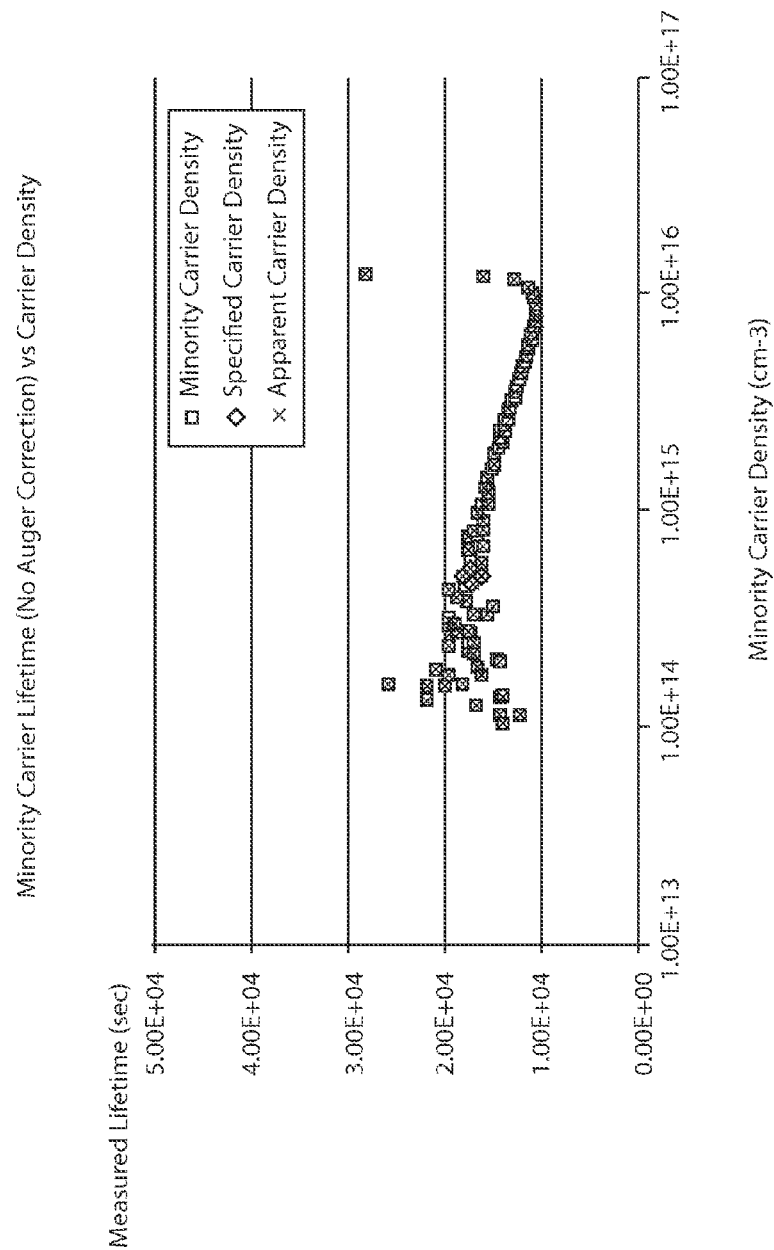
FIG. 9 is a graph showing minority carrier lifetime in seconds versus Carrier Density in atoms/cm$^{-3}$ for a passivation simulation in accordance with the present principles.

Referring to FIG. 9, a graph of minority carrier lifetime in seconds versus Carrier Density in atoms/cm$^{-3}$ is shown for a passivation experiment. Approximately 3 nm of n$^+$ a-Si:H was grown on both sides of p-type (Float Zone) FZ Si wafer (with a bulk lifetime, t$_{bulk}$≈1.3 ms). The 3 nm represented a passivation layer on an n+ emitter. Equation (1) provides: 1/t$_{eff}$=1/t$_{bulk}$+2S/W, where W (wafer thickness)=300 μm, and S is the surface recombination velocity (SRV) S≈100 cm/s. For the above, t$_{eff}$≈150 μs at 10$^{15}$ cm$^{-3}$ and therefore the 3 nm passivation layer thickness is well suited for passivating of n$^+$ epitaxially grown layer (emitter).

Figure 10:
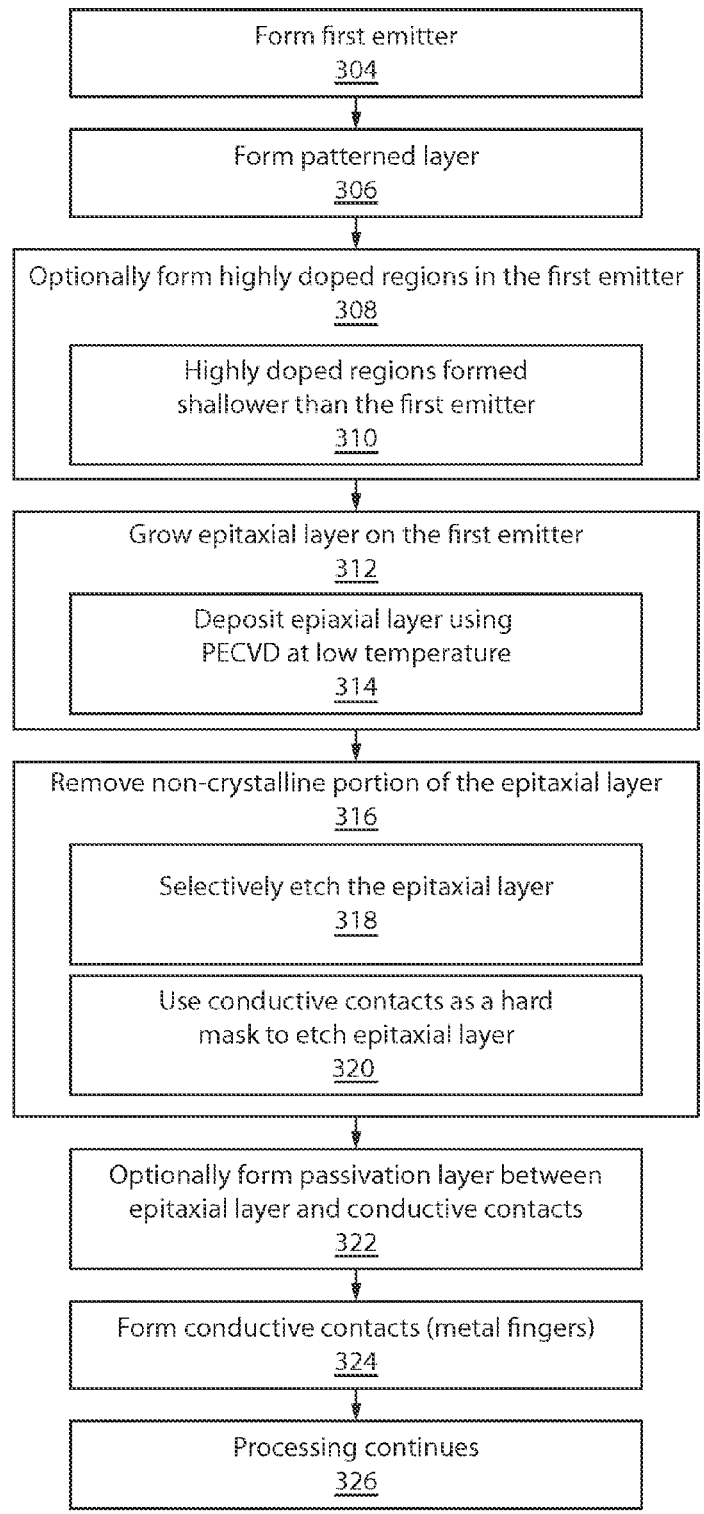
FIG. 10 is a block/flow diagram showing method for fabricating a photovoltaic device in accordance with illustrative embodiments.

Referring to FIG. 10, methods for fabricating a photovoltaic device are illustratively depicted in accordance with the present principles. The flowchart and/or block diagram of the FIG. 10 illustrates the architecture, functionality, and operation of possible implementations according to various embodiments of the present invention. It should also be noted that, in some alternative implementations, the functions noted in the blocks may occur out of the order noted in FIG. 10. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 304, an emitter layer (first emitter) is formed on a substrate, preferably a monocrystalline semiconductor substrate; however, a multi-crystalline substrate may be used as well. The emitter layer may be formed by doping the substrate using a diffusion process (diffusion layer and anneal/drive-in), ion/dopant implantation or other doping process. In another embodiment, an emitter layer may be epitaxially grown on the substrate and doped in-situ (or after formation of the epitaxial layer). It should be noted that the substrate and the emitter layer (first emitter) have opposite doping conductivity.

In block 306, a patterned layer is formed on the doped emitter layer or portion of the photovoltaic device. The patterned layer includes openings that expose areas of the doped emitter layer. The patterned layer may include one or more of a passivation layer and an anti-reflection coating on the doped emitter portion.

In block 308, portions of the doped emitter layer may be further doped (e.g., ion or dopant implantation) to form highly doped diffusion regions having a dopant concentration greater than other portions of the doped emitter portion. The highly doped diffusion regions correspond to locations of the openings in the patterned layer. In block 310, the highly doped diffusion regions extend to a depth that is shallower than a thickness of the doped emitter layer. This depth may be 5%-70% of a depth of the emitter layer, more preferably between 40% and 60% (no long drive-in). The highly doped diffusion regions have a same dopant conductivity as the emitter layer and an increased dopant concentration.

In block 312, an epitaxial layer is grown over the patterned layer such that a crystalline phase grows in contact with the doped emitter layer and a non-crystalline phase grows in contact with the patterned layer. The doped emitter layer forms a first emitter, and the epitaxial layer forms a second emitter. The first and second emitters include a same dopant conductivity. In one embodiment, the highly doped diffusion regions may also be formed by annealing the epitaxial layer, which is formed in contact with the doped emitter layer in the openings of the patterned layer. Dopants may diffuse into the doped emitter layer from the epitaxial layer.

In block 314, the epitaxial layer is deposited using a plasma enhanced chemical vapor deposition process (PECVD) at a temperature less than 400 degrees C. In a particularly useful embodiment, the epitaxial layer is deposited at a temperature between 150 and 250 degrees C. with a gas ratio of $[H_2]/[SiH_4]>5$ for silicon growth or a gas flow ratio of $[H_2]/([SiH_4]+[GeH_4])>5$ for SiGe growth. Other processes may include hot wire CVD (HWCVD) or the like.

In block 316, the non-crystalline phase is removed from the patterned layer. In block 318, removing the non-crystalline phase from the patterned layer may include employing a selective etch (e.g., a wet etch or a dry H plasma etch, etc.) to selectively remove the non-crystalline phase. In block 320, removing the non-crystalline phase from the patterned layer may include employing the conductive contacts (to be formed) as a hard mask to etch the non-crystalline phase.

In block 322, a passivation layer (e.g., surface passivation layer) may be formed on the epitaxial layer, which is disposed between the epitaxial layer and conductive contacts to be formed.

In block 324, conductive contacts are formed on the epitaxial layer in the openings to form a contact area of the photovoltaic device. The conductive contacts may include metal fingers corresponding to positions of the openings.

In block 326, processing continues to complete the photovoltaic device. It should be understood that additional process steps, layers, and components may be included with or instead of those described herein. The contact area formed may include a front contact area (e.g., monofacial device), but may also include a back contact area (e.g., for bifacial devices) in addition to or instead of the front contact area.

Having described preferred embodiments for a selective emitter photovoltaic device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A photovoltaic device, comprising:
a contact area including:
a doped emitter layer having a first conductivity on a substrate having a second conductivity;
a patterned layer formed on the doped emitter layer, the patterned layer including openings that expose areas of the doped emitter layer;
an epitaxial layer having a crystalline phase grown in contact with an upper surface of the doped emitter portion, the epitaxial layer having a same conductivity type as the doped emitter layer with a greater doping concentration than the doped emitter layer;
a diffusion region having a first conductivity extending from the epitaxial layer into the doped emitter layer; and
conductive contacts formed on the epitaxial layer in the openings.

2. The device as recited in claim 1, wherein the doped emitter layer is formed in or on a monocrystalline substrate.

3. The device as recited in claim 1, wherein the doped emitter layer forms a first emitter and the epitaxial layer forms a second emitter wherein the first and second emitters include a same dopant conductivity.

4. The device as recited in claim 1, further comprising highly doped diffusion regions formed in the doped emitter layer and having a dopant concentration greater than other portions of the doped emitter portion, the highly doped diffusion regions corresponding with locations of the openings in the patterned layer.

5. The device as recited in claim 4, wherein the highly doped diffusion regions extend to a depth that is shallower than a thickness of the doped emitter portion.

6. The device as recited in claim 1, wherein the patterned layer includes one or more of a passivation layer and an anti-reflection coating.

7. The device as recited in claim 1, further comprising a passivation layer between the epitaxial layer and the conductive contacts.

8. The device as recited in claim 1, wherein the conductive contacts includes include metal fingers corresponding to positions of the openings.

9. The device as recited in claim 1, wherein the epitaxial layer includes single crystalline or poly crystalline material formed using a plasma enhanced chemical vapor deposition process at a temperature less than 400 degrees C.

* * * * *